(12) United States Patent
Yamada et al.

(10) Patent No.: US 7,557,017 B2
(45) Date of Patent: Jul. 7, 2009

(54) METHOD OF MANUFACTURING SEMICONDUCTOR DEVICE WITH TWO-STEP ETCHING OF LAYER

(75) Inventors: Hiroshi Yamada, Gunma (JP); Keiichi Yamaguchi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 482 days.

(21) Appl. No.: 11/191,276

(22) Filed: Jul. 28, 2005

(65) Prior Publication Data

US 2006/0024949 A1 Feb. 2, 2006

(30) Foreign Application Priority Data

Jul. 29, 2004 (JP) ............................. 2004-221438

(51) Int. Cl.
*H01L 21/00* (2006.01)
(52) U.S. Cl. .................. 438/462; 438/113; 438/460; 257/620; 257/621; 257/E21.599
(58) Field of Classification Search ................ 438/113, 438/462, 114, 460–461, 463–465; 257/620, 257/621, E23.061, E21.599
See application file for complete search history.

(56) References Cited

U.S. PATENT DOCUMENTS

| | | | | |
|---|---|---|---|---|
| 6,573,157 | B1 * | 6/2003 | Sato ............................. | 438/462 |
| 6,646,289 | B1 * | 11/2003 | Badehi ......................... | 257/81 |
| 6,781,244 | B2 * | 8/2004 | Prabhu ......................... | 257/778 |
| 6,835,592 | B2 * | 12/2004 | Hall et al. .................... | 438/106 |
| 7,067,354 | B2 * | 6/2006 | Prabhu ......................... | 438/113 |
| 7,112,881 | B2 * | 9/2006 | Kaida et al. .................. | 257/698 |
| 7,495,341 | B2 * | 2/2009 | Zilber et al. ................. | 257/778 |
| 2002/0016024 | A1 * | 2/2002 | Thomas ....................... | 438/113 |
| 2002/0043686 | A1 * | 4/2002 | Bolam et al. ................. | 257/349 |
| 2003/0230805 | A1 * | 12/2003 | Noma et al. .................. | 257/737 |
| 2004/0121562 | A1 * | 6/2004 | Wakui et al. ................. | 438/465 |
| 2004/0137723 | A1 * | 7/2004 | Noma et al. .................. | 438/667 |
| 2004/0161920 | A1 * | 8/2004 | Noma .......................... | 438/620 |
| 2004/0235270 | A1 * | 11/2004 | Noma et al. .................. | 438/460 |

(Continued)

FOREIGN PATENT DOCUMENTS

WO WO-99/40624 A1 8/1999

(Continued)

*Primary Examiner*—Laura M Menz
*Assistant Examiner*—Joseph C Nicely
(74) *Attorney, Agent, or Firm*—Morrison & Foerster LLP

(57) ABSTRACT

The invention is directed to improvement of reliability of a process of separating a layer to be patterned such as a wiring layer in a semiconductor device manufacturing method. A wiring layer is formed on a back surface of a semiconductor substrate. A third resist layer (positive resist layer) is formed on the wiring layer, having an opening in a predetermined region along a dicing line at a bottom of the opening, and the wiring layer is etched using the third resist layer as a mask. After the third resist layer is removed, a fourth resist layer (negative resist layer) is formed on the wiring layer so as to leave the wiring layer in a region of a predetermined pattern, and the wiring layer is etched using the fourth resist layer as a mask. The wiring layer is thus patterned so as to form the predetermined pattern and be separated at the predetermined region along the dicing line at the bottom of the opening without fail.

20 Claims, 11 Drawing Sheets

U.S. PATENT DOCUMENTS

| | | | |
|---|---|---|---|
| 2004/0262732 A1* | 12/2004 | Noma et al. | 257/685 |
| 2005/0062146 A1* | 3/2005 | Kaida et al. | 257/698 |
| 2005/0208735 A1* | 9/2005 | Noma et al. | 438/460 |
| 2006/0068572 A1* | 3/2006 | Noma et al. | 438/577 |
| 2006/0141750 A1* | 6/2006 | Suzuki et al. | 438/460 |
| 2008/0093708 A1* | 4/2008 | Noma et al. | 257/620 |
| 2008/0171421 A1* | 7/2008 | Suzuki et al. | 438/459 |

FOREIGN PATENT DOCUMENTS

WO    WO 2004/044981 A1 *   5/2004

* cited by examiner

METHOD OF MANUFACTURING SEMICONDUCTOR DEVICE WITH TWO-STEP ETCHING OF LAYER

CROSS-REFERENCE OF THE INVENTION

This invention is based on Japanese Patent Application No. 2004-221438, the content of which is incorporated by reference in its entirety.

BACKGROUND OF THE INVENTION

1. Field of the Invention

This invention relates to a semiconductor device manufacturing method, particularly, a method of manufacturing a chip size package type semiconductor device.

2. Description of the Related Art

CSP (Chip Size Package) has received attention in recent years as a packaging technology. The CSP means a small package having almost the same outside dimensions as those of a semiconductor die packaged in it. Conventionally, BGA (ball grip array) type semiconductor devices have been known as a kind of CSP type semiconductor devices. In this BGA type semiconductor device, a plurality of ball-shaped conductive terminals made of metal such as solder is arrayed in a grid pattern on one surface of the package, and electrically connected with the semiconductor die mounted on the other side of the package.

When this BGA type semiconductor device is mounted on electronic equipment, the semiconductor die is electrically connected with an external circuit on a printed circuit board by compression bonding of the ball-shaped conductive terminals to wiring patterns on the printed circuit board.

Such a conventional BGA type semiconductor device is manufactured by a following manufacturing method, for example.

First, a semiconductor substrate sectioned by a dicing line is prepared. Electronic devices are formed on a front surface of the semiconductor substrate. Then, pad electrodes connected with the electronic devices are formed on the front surface of the semiconductor substrate. Furthermore, a support body is formed on the front surface of the semiconductor substrate. Then, openings exposing the pad electrodes are formed along the dicing line by selectively etching a part of the semiconductor substrate from its back surface. A wiring layer is then formed, being electrically connected with the pad electrodes exposed in the openings and extending from an inside of the openings onto the back surface of the semiconductor substrate. Furthermore, the wiring layer is selectively etched to form a predetermined wiring pattern. Then, a protection layer exposing a part of the wiring layer is formed on the back surface of the semiconductor substrate including on the wiring layer, and conductive terminals are formed on a part of the wiring layer. Finally, the semiconductor substrate is separated into a plurality of semiconductor dice by dicing along the dicing line. The relevant technology is disclosed in the Japanese Patent Application Publication No. 2002-512436.

By the conventional BGA type semiconductor device manufacturing method described above, the wiring layer formed on the back surface of the semiconductor substrate is separated along the dicing line DL together with the semiconductor substrate when dicing is performed. Alternatively, the wiring layer is separated by patterning after the wiring layer is formed. Next, the process of separating the wiring layer formed on the back surface of the semiconductor substrate will be described with reference to drawings. FIGS. 19 to 21 are cross-sectional views showing the conventional semiconductor device manufacturing method. FIGS. 19 to 21 show a portion near the dicing line DL of the semiconductor substrate formed with an opening.

As shown in FIG. 19, when a wiring layer 58 on a back surface of a semiconductor substrate 50 including an opening 50w is separated by dicing, a dicing blade 40 comes in contact with the wiring layer 58 and makes stresses or impact on it. This causes damages to the wiring layer 58 such as peeling. Furthermore, although not shown, moisture used for dicing or cutting dust remains on a cut surface of the wiring layer 58, causing corrosion in the wiring layer 58 after dicing. That is, reliability of the semiconductor device reduces.

In a case that the wiring layer 58 is separated by patterning after the wiring layer 58 is formed on the back surface of the semiconductor substrate 50 including the opening 50w, as shown in FIG. 20, the described dicing blade need not be used. In this method, a resist layer 59 (made of a negative resist layer) as an etching mask is formed on the wiring layer 58, and the wiring layer 58 is selectively removed by etching.

However, when exposure is performed, using a mask 60 for patterning the resist layer 59, light reflected at the resist layer 59 formed on a sidewall of the opening 50w reaches the resist layer 59 at a bottom of the opening 50w under the mask 60. Therefore, as shown in FIG. 21, the resist layer 59a to be removed is failed to be removed and remains. Although not shown, when etching is performed using the resist layer 59 as an etching mask after then, too, the wiring layer 58 to be removed is failed to be removed and remains. In this case, the wiring layer 58 remains on the dicing line DL to become an obstacle to dicing, so that reliability of the semiconductor device reduces like in the described method of separating the wiring layer 58 by dicing.

SUMMARY OF THE INVENTION

The invention provides a method of manufacturing a semiconductor device. The method includes providing a semiconductor substrate, forming a recess in the substrate along a dicing line of the substrate by etching the substrate from a back surface thereof, forming a layer that is disposed in the recess and on the back surface of the substrate, forming a first resist layer on the layer so that the first resist layer has an opening at a predetermined location at a bottom of the recess, etching the layer using the first resist layer as a mask so as to make an opening in the layer, removing the first resist layer to expose the layer, forming on the exposed layer a second resist layer that corresponds to a predetermined pattern and covers the opening of the layer, and etching the layer using the second resist layer as a mask so that the predetermined pattern is reflected in the layer.

As an alternative, the layer is first etched to form the predetermined pattern and then etched again to create the opening in the patterned layer.

The invention also provides another method of manufacturing a semiconductor device. The method includes providing a semiconductor substrate having a first insulation film formed on a front surface of the substrate and a pad electrode formed on the first insulation film along a dicing line of the substrate, attaching a support body to the front surface of the substrate, and forming a recess in the substrate along the dicing line by etching the substrate from its back surface. The recess corresponds to the entire length of the dicing line or part of the length. The method also includes forming a second insulation film to cover the recess and the back surface of the substrate, etching the first and second insulation films at a bottom of the recess so that part of the pad electrode is exposed, forming a wiring layer that is disposed in the recess and on the back surface of the substrate and connected with the exposed pad electrode, forming a first resist layer on the wiring layer so that the first resist layer has an opening at a predetermined location at the bottom of the recess, etching the wiring layer using the first resist layer as a mask so as to make an opening in the wiring layer, removing the first resist layer to expose the wiring layer, forming on the exposed wiring layer a second resist layer that corresponds to a predetermined pattern and covers the opening of the wiring layer, and etching the wiring layer using the second resist layer as a mask so that the predetermined pattern is reflected in the wiring layer.

As an alternative, the wiring layer is first etched to form the predetermined pattern and then etched again to create the opening in the patterned wiring layer.

DETAILED DESCRIPTION OF THE INVENTION

Figure 3:
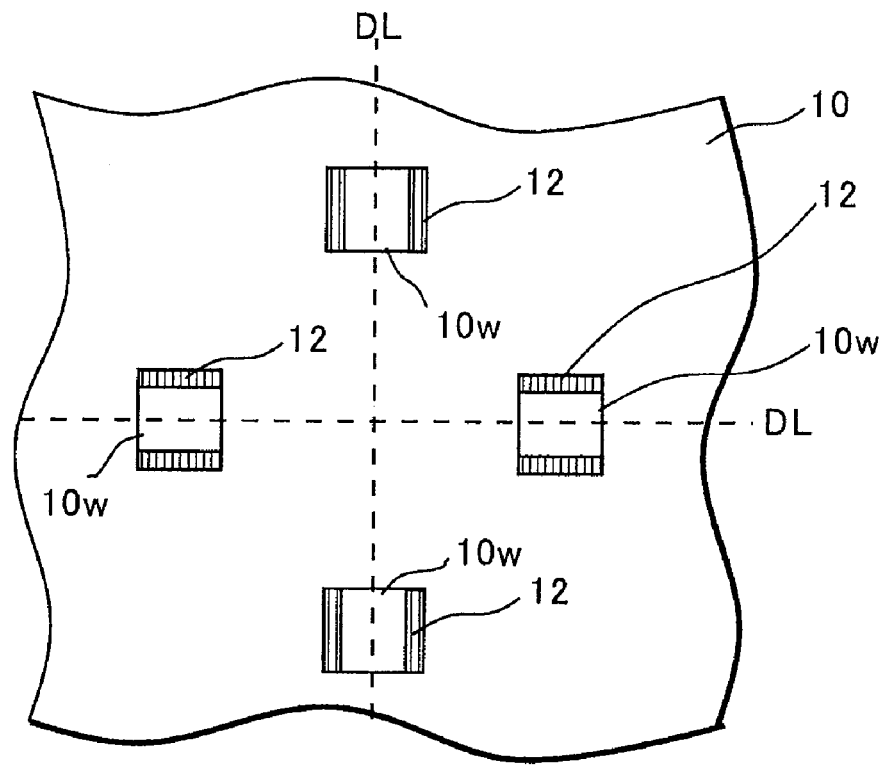
FIGS. 3 and 4 are top views showing the semiconductor device manufacturing method of the first embodiment of the invention.
Figure 4:
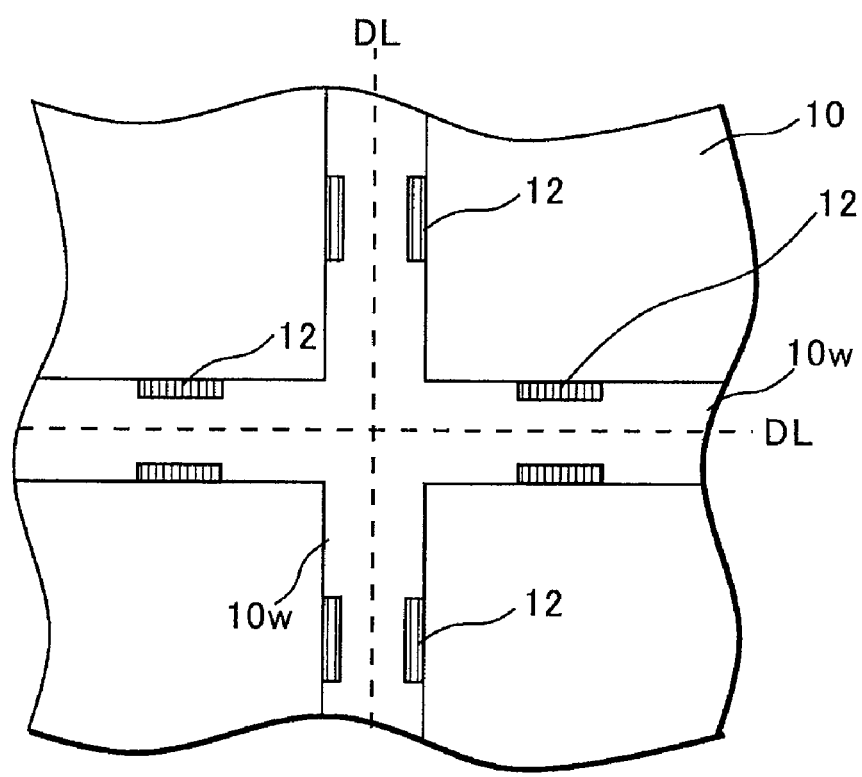
Figure 12:
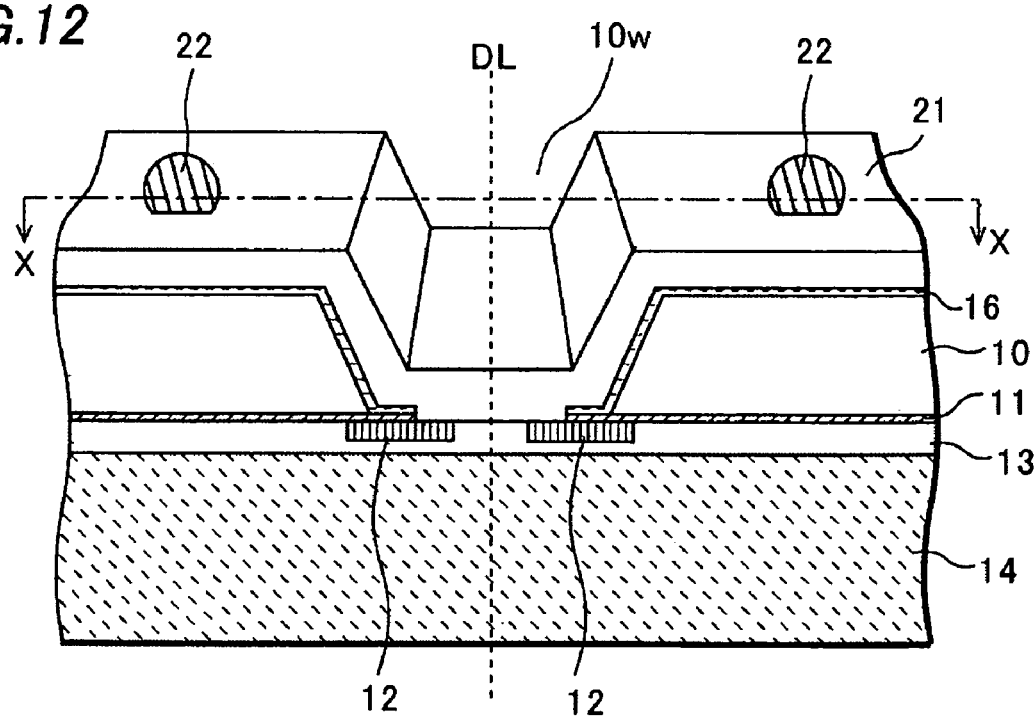
Figure 13:
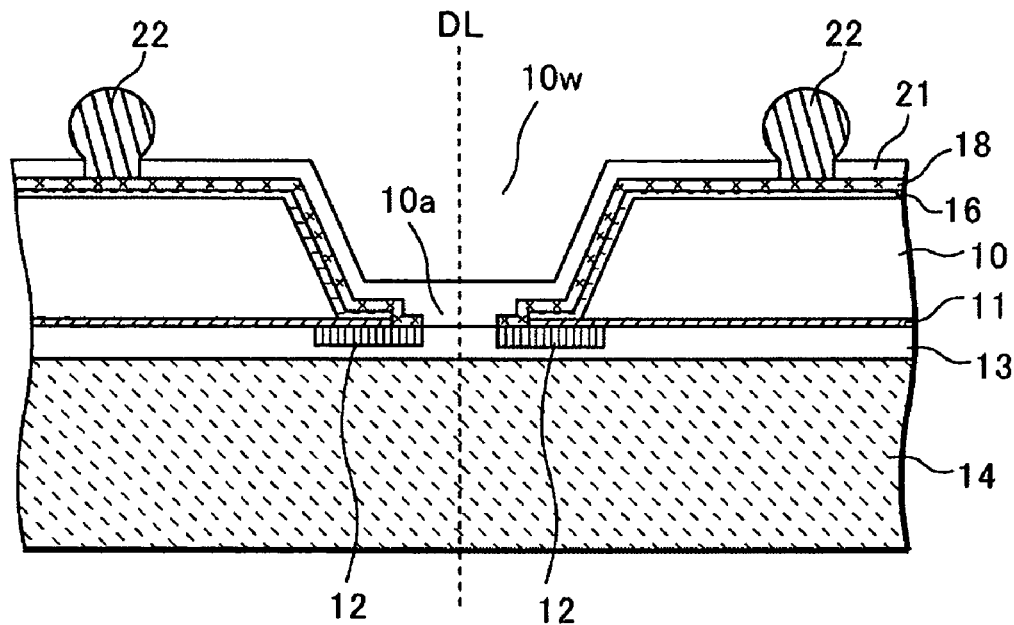
FIGS. 13 and 14 are cross-sectional views showing the semiconductor device manufacturing method of the first embodiment of the invention.
Figure 14:
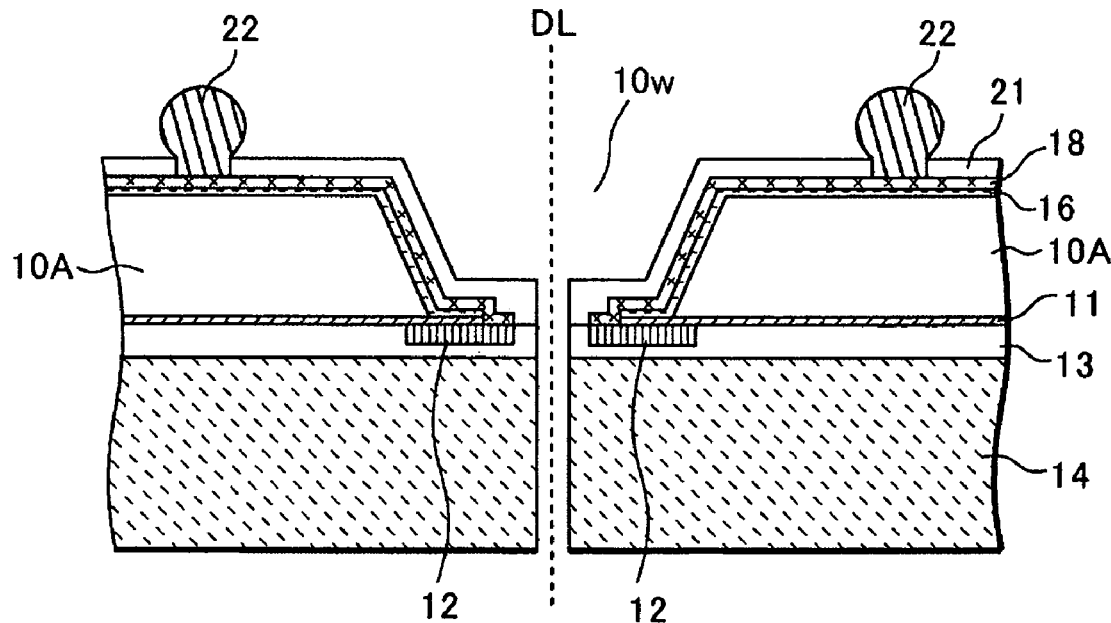

A semiconductor device manufacturing method of a first embodiment of the invention will be described with reference to drawings. FIGS. 2, and 5 to 12 are three-dimensional views showing the semiconductor device manufacturing method of the first embodiment. FIGS. 3 and 4 are top views showing the semiconductor device manufacturing method of the first embodiment. FIGS. 13 and 14 are cross-sectional views along line X-X in FIG. 12, showing the semiconductor device manufacturing method of the first embodiment. It is noted that FIGS. 1 to 14 show a portion near a dicing line DL of a semiconductor substrate.

Figure 1:
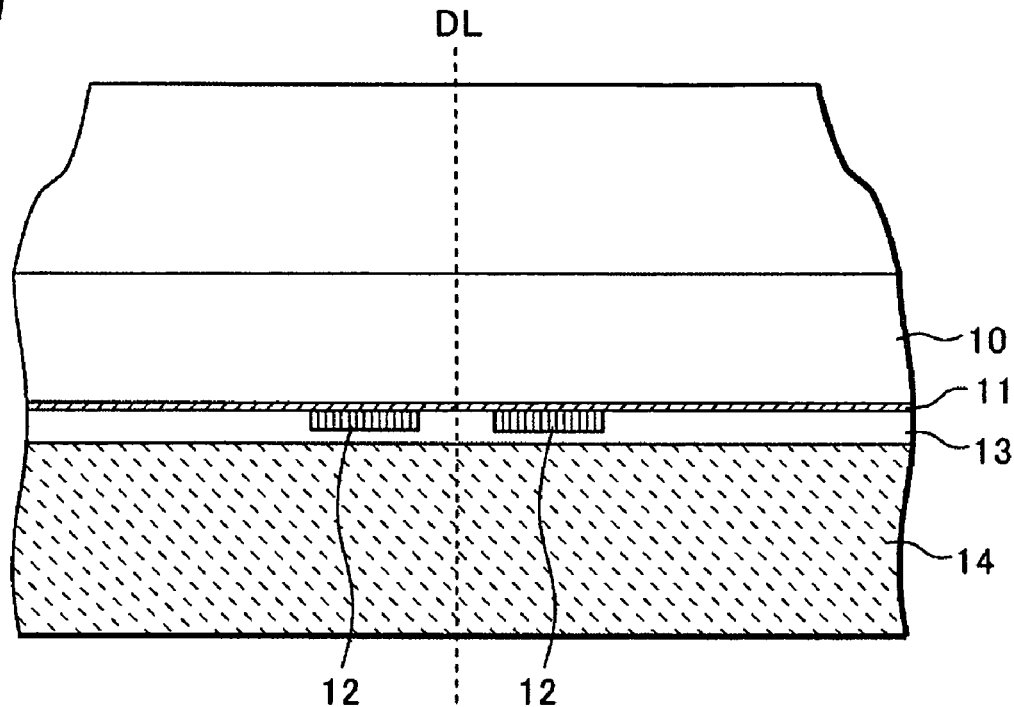
FIGS. 1 and 2 are three-dimensional views showing a semiconductor device manufacturing method of a first embodiment of the invention.

First, a semiconductor substrate 10 sectioned by the dicing line DL and formed with electronic devices (not shown) is prepared as shown in FIG. 1. The electronic devices are light receiving elements such as CCD (charge coupled device) or an infrared ray sensor, or light emissive elements, for example. Alternatively, the electronic devices can be other ones than the light receiving elements or the light emissive elements. The semiconductor substrate 10 is formed of a silicon substrate, for example, but can be formed of the other material.

Then, a first insulation film 11 as an interlayer insulation film is formed on a front surface of the semiconductor substrate 10 including the electronic devices. The first insulation film 11 is formed of a P-TEOS film, a BPSG film and so on, for example.

Then, pad electrodes 12 as external connection electrodes connected with the electronic devices are formed on the front surface of the semiconductor substrate 10 with the first insulation film 11 therebetween. The pad electrodes 12 are preferably formed of aluminum (Al) by sputtering, but can be formed of other metal.

Next, a substrate-like or tape-like support body 14 is formed on the front surface of the semiconductor substrate 10 including the pad electrodes 12 with a resin layer 13 therebetween. In the case that the electronic devices are the light receiving elements or the light emissive elements, the support body 14 is formed of a transparent or semitransparent material such as glass. In the case that the electronic devices are not the light receiving elements or the light emissive elements, the support body 14 is not necessarily formed of a transparent or semitransparent material.

Figure 2:
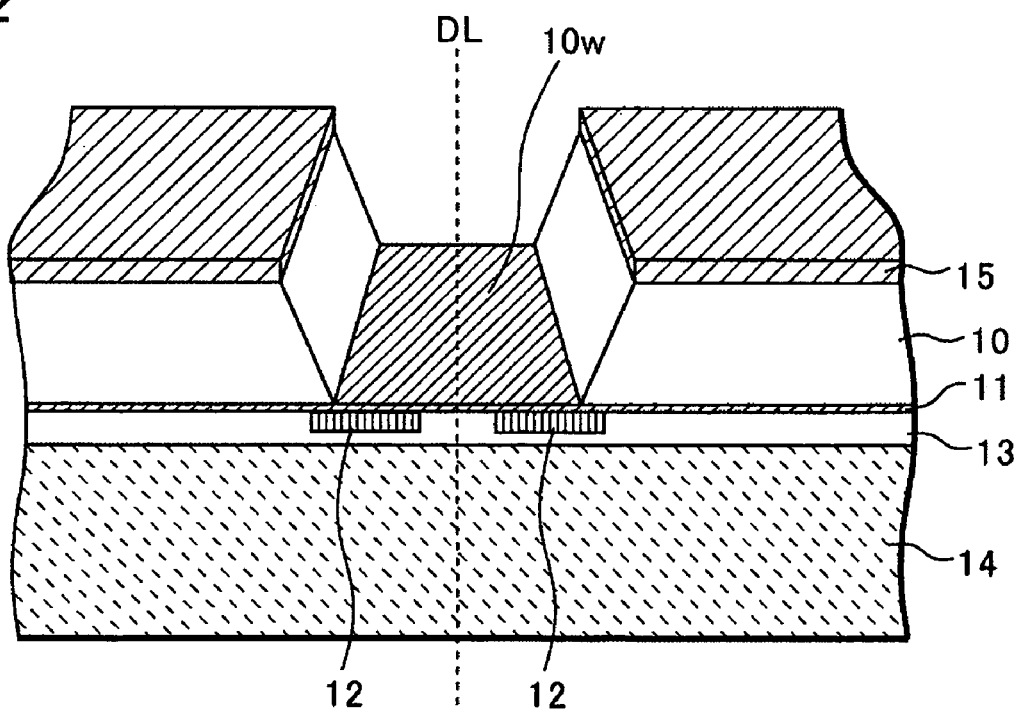

Next, a first resist layer 15 having an opening along a part of the dicing line DL or the whole dicing line DL is formed on the back surface of the semiconductor substrate 10, as shown in FIG. 2. Then, the semiconductor substrate 10 is partially and selectively etched from its back surface by, preferably, isotropic etching using the first resist layer 15 as a mask. By this etching, an opening 10w is formed in the semiconductor substrate 10 along a part of the dicing line DL or the whole dicing line DL. The opening 10w is formed so as to penetrate the semiconductor substrate 10. The first insulation film 11 is exposed at a bottom of the opening 10w. It is noted that this etching can be anisotropic etching.

A top view of the opening 10w seen from the back surface side of the semiconductor substrate 10 is shown in FIG. 3 or 4. That is, as shown in FIG. 3, the opening 10w is formed locally in the semiconductor substrate 10 along a part of the dicing line DL including regions above the pad electrodes 12. Alternatively, as shown in FIG. 4, the opening 10w is formed in the semiconductor substrate 10 along the whole dicing line DL including the regions above the pad electrodes 12 so as to from a trench shape.

Figure 5:
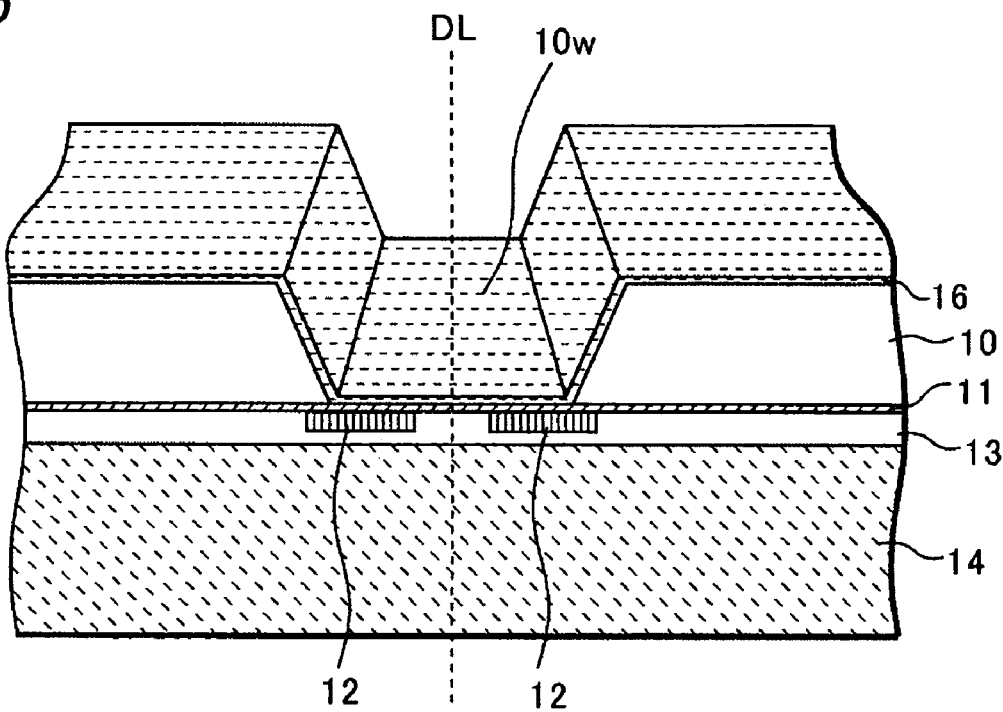
FIGS. 5-12 are three-dimensional views showing the semiconductor device manufacturing method of the first embodiment of the invention.
Figure 6:
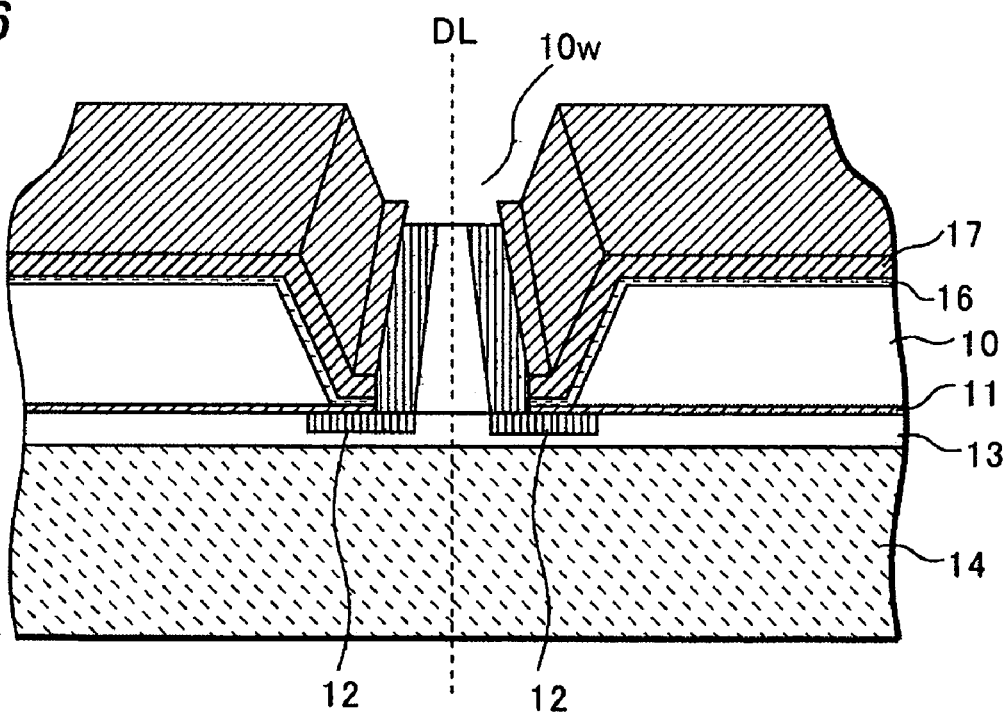

Then, a second insulation film 16 is formed as a back surface insulation film on the back surface of the semiconductor substrate 10 including the inside of the opening 10w, as shown in FIG. 5. The second insulation film 16 is formed of a silicon oxide film ($SiO_2$ film) or a silicon nitride film (SiN film), for example, and formed by a plasma CVD method, for example.

Then, a second resist layer 17 is formed on the second insulation film 16, having an opening at the bottom of the opening 10w in a region above a part of the pad electrodes 12 to the dicing line DL. Then, by using the second resist layer 17 as a mask, the second insulation film 16 and the first insulation film 11 are etched from the back surface side of the semiconductor substrate 10 by, preferably, wet etching with hydrofluoric acid (HF). This etching can be performed by other etching than the wet etching.

By this etching, the first insulation film 11 and the second insulation film 16 formed in a region from above a part of the pad electrodes 12 to the dicing line DL are removed. That is, a part of the pad electrodes 12 and a part of the resin layer 13 bonding the support body 14 to the semiconductor substrate 10 are exposed at the bottom of the opening 10w.

Figure 7:
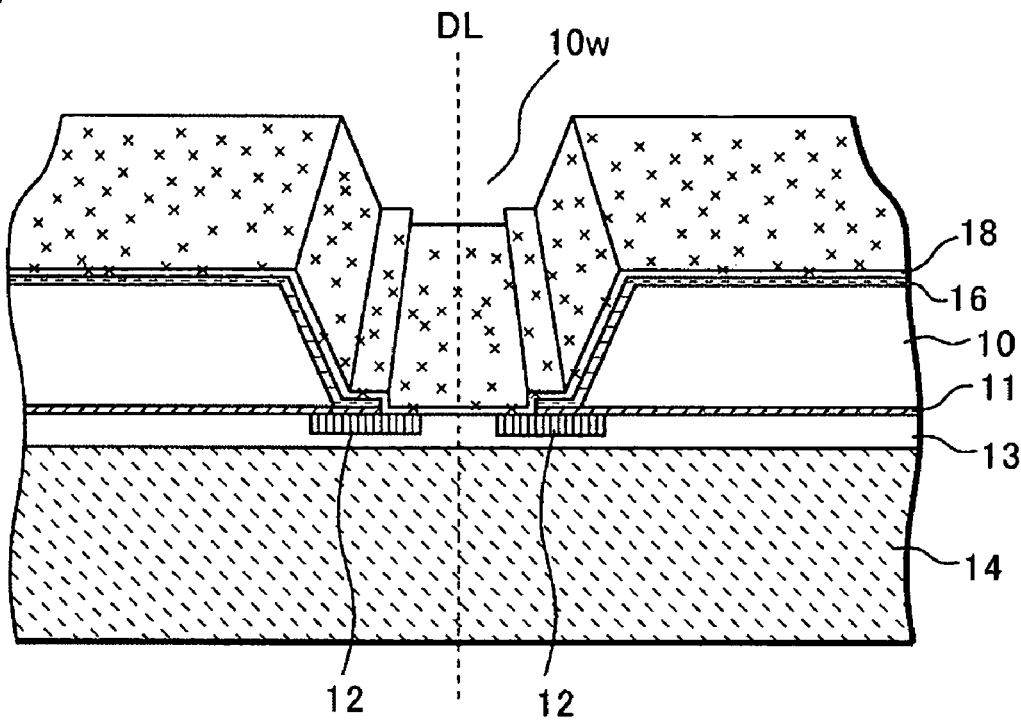

After the second resist layer 17 is removed, as shown in FIG. 7, a wiring layer 18 formed of, for example, aluminum (Al) is formed on the whole surface including on a part of the pad electrodes 12 exposed in the opening 10w and on the second insulation film 16 on the back surface of the semiconductor substrate 10 including an inside of the opening 10w by a sputtering method or the other deposition method. It is preferable that the thickness of the wiring layer 18 is about 3

μm. At this time, the wiring layer 18 is electrically connected with the pad electrodes 12 exposed at the bottom of the opening 10w.

Alternatively, the wiring layer 18 can be formed of other metal than aluminum (Al). For example, although not shown, the wiring layer 18 can be formed of a barrier seed layer formed of a barrier metal layer and a seed layer and plated with metal such as copper (Cu) thereon.

Figure 8:
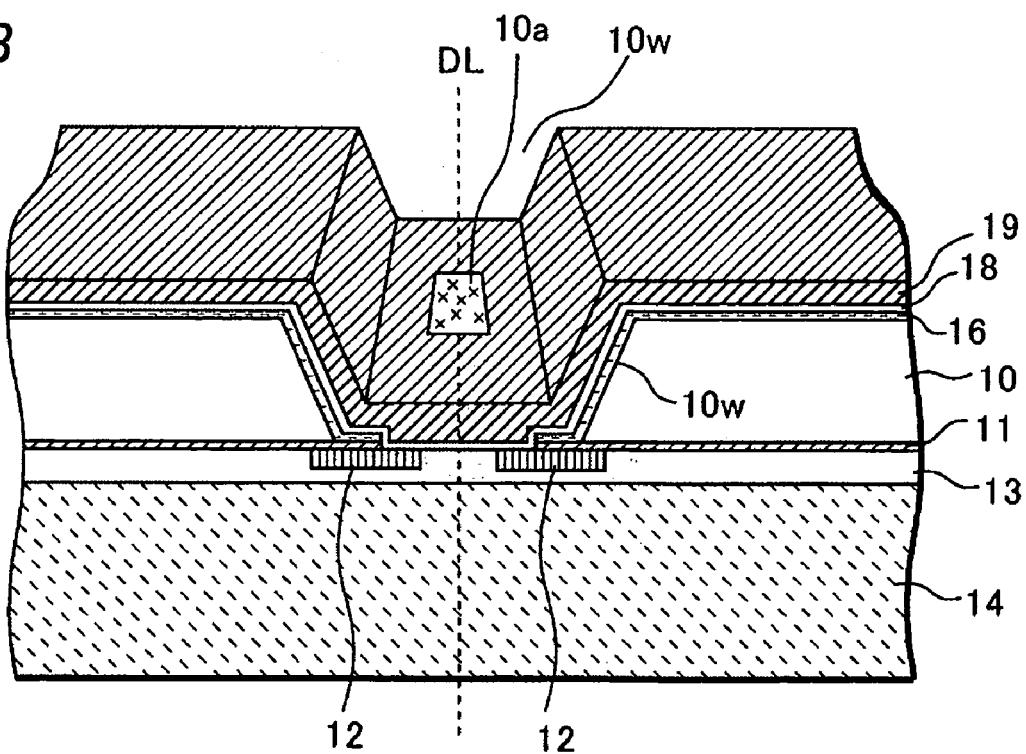

Then, a third resist layer 19 is formed on the wiring layer 18 on the back surface of the semiconductor substrate 10 including the inside of the opening 10w, as shown in FIG. 8. The third resist layer 19 is a positive resist layer of which an exposed part is to be removed by development. It is preferable that the thickness of the third resist layer 19 is about 10 μm.

Then, exposure is performed to the third resist layer 19, using a mask (not shown) covering this layer 19 except a predetermined region 10a along the dicing line DL at the bottom of the opening 10w. The predetermined region 10a along the dicing line DL at the bottom of the opening 10w is a region which is formed with no pad electrodes 12 at the bottom of the opening 10w and corresponds to a predetermined pattern of the wiring layer 18.

As described above, the positive resist layer is used as the third resist layer 19 for the exposure, and the exposure is performed to the third resist layer 19, using the mask (not shown) covering this layer 19 except the predetermined region 10a. This does not lead to the problem described in the related art that light reaches a sidewall of an opening 50w and thus the light reflected there reaches a predetermined region of a resist layer 59 at a bottom of the opening 50w to leave the resist layer 59 there. Therefore, it can be prevented that the third resist layer 19 in the predetermined region 10a at the bottom of the opening 10w, which is to be removed, is failed to be removed and remains there.

Then, development is performed to remove the third resist layer 19 in the predetermined region 10a along the dicing line DL at the bottom of the opening 10w. The wiring layer 18 under the third resist layer 19 is exposed only in the predetermined region 10a along the dicing line DL at the bottom of the opening 10w.

Next, by using the third resist layer 19 as a mask, the wiring layer 18 is selectively etched and removed. This selective removing process is preferably performed by wet etching with sodium hydroxide (NaOH) or can be performed by other etching than the wet etching.

Figure 9:
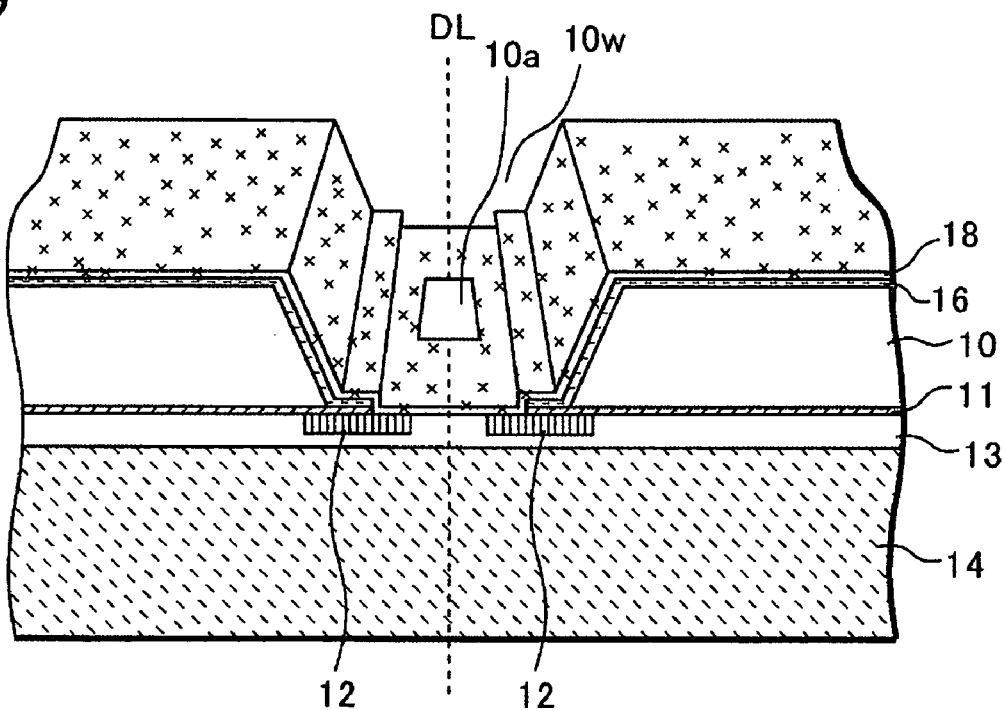

Then, the third resist layer 19 is removed as shown in FIG. 9. By selectively removing the wiring layer 18, the wiring layer 18 is removed only in the predetermined region 10a along the dicing line DL at the bottom of the opening 10w. In the predetermined region 10a where the wiring layer 18 is removed, a part of the resin layer 13 bonding the supporting layer 14 to the semiconductor substrate 10 is exposed.

Figure 10:
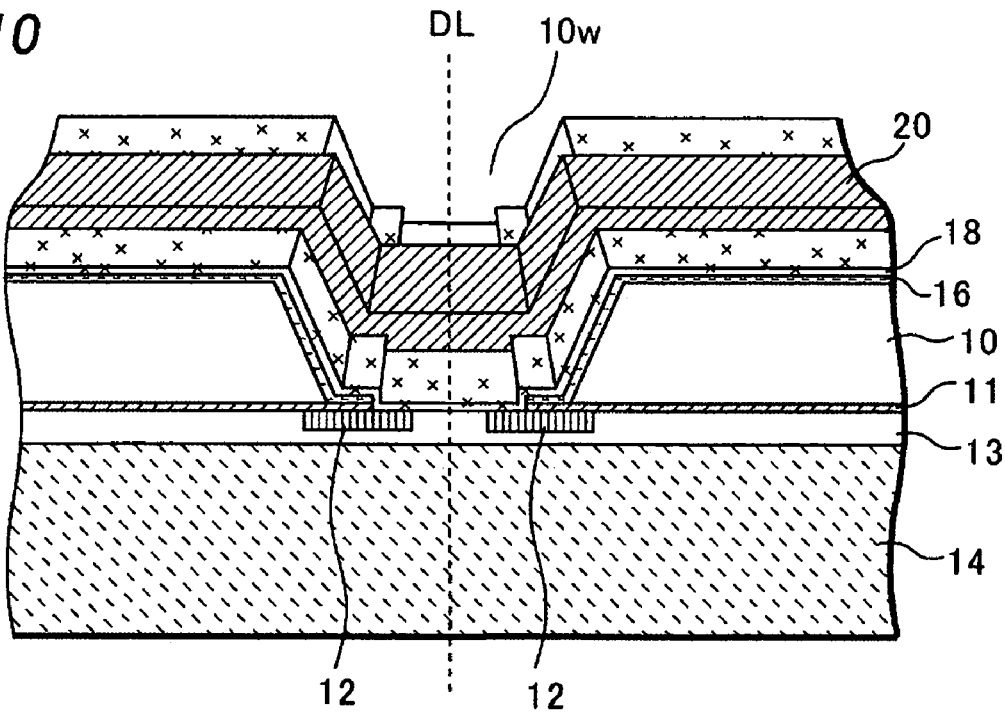

Then, a fourth resist layer 20 for patterning the wiring layer 18 in a predetermined pattern is formed on the wiring layer 18 on the back surface of the semiconductor substrate 10 including the inside of the opening 10w, as shown in FIG. 10. The fourth resist layer 20 is a negative resist layer of which an unexposed part is to be removed by development. The thickness of the fourth resist layer 20 is preferably about 10 μm.

Then, exposure is performed to the fourth resist layer 20, using a mask (not shown) covering this layer 20 except a region above the wiring layer 18 to be left corresponding to the predetermined pattern. Then, development is performed to selectively remove the fourth resist layer 20.

Next, the wiring layer 18 is selectively etched using the fourth resist layer 20 as a mask. This selective removing process is preferably performed by wet etching using sodium hydroxide (NaOH) or can be performed by other etching than the wet etching.

Figure 11:
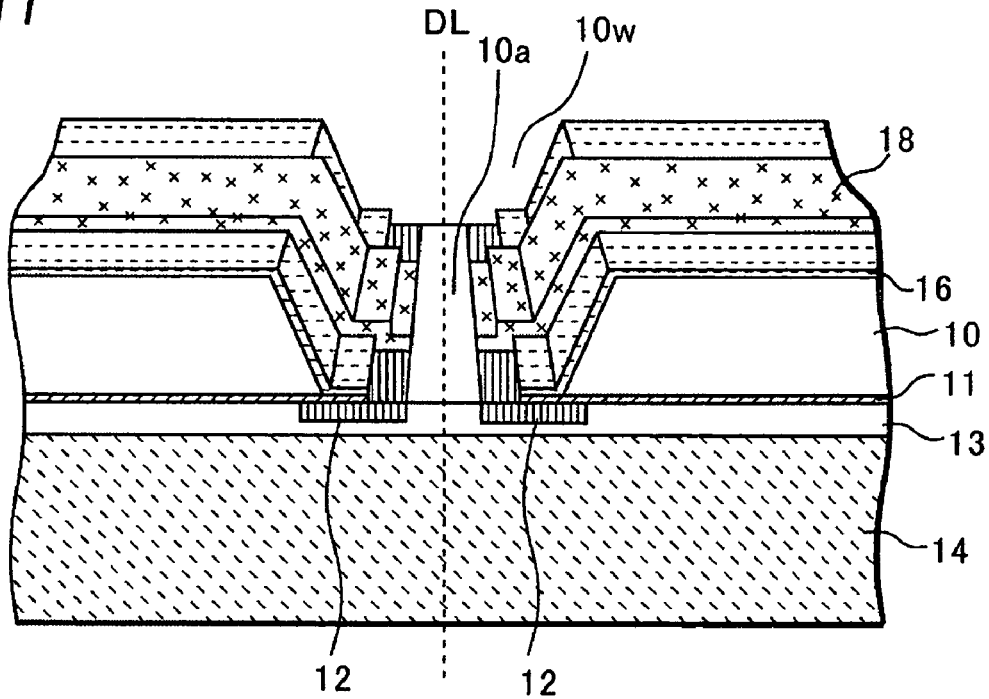

Then, the fourth resist layer 20 is removed as shown in FIG. 11. By selectively removing the wiring layer 18 as described above, the wiring layer 18 is removed in its unnecessary portion to form the predetermined pattern. The wiring layer 18 in the predetermined region 10a along the dicing line DL at the bottom of the opening 10w is already removed selectively in the previous process.

As described above, the wiring layer 18 undergoes two selective removing processes using the third resist layer 19 and the fourth resist layer 20, so that the wiring layer 18 is patterned so as to form the predetermined pattern and be separated at the predetermined region 10a along the dicing line DL at the bottom of the opening 10w without fail.

By selectively removing the wiring layer 18 as described above, it can be prevented that the wiring layer remains on the dicing line DL at the bottom of the opening 50w as has been seen in the conventional art. That is, in a process of separating a layer to be patterned such as the wiring layer 18 formed on the semiconductor substrate 10 having a three-dimensional structure like having the opening 10w, reliability can be improved more than the conventional art.

Furthermore, in the exposure process performed when the third resist layer 19 or the fourth resist layer 20 is selectively removed, it is not necessary to devote care on an effect of light being reflected at the sidewall of the opening 10w and reaching the bottom thereof. Therefore, conditions for performing exposure to the resist layer can be eased.

Next, a protection layer 21 is formed on the back surface of the semiconductor substrate 10 including on the wiring layer 18 as shown in FIG. 12. This protection layer 21 is formed of a resist material or other material. Furthermore, openings are formed in the protection layer 21 so as to expose a part of the wiring layer 18, and conductive terminals 22 are formed on the part of the wiring layer 18. These conductive terminals 22 are formed of, for example, solder, and have ball-shapes. A cross-section of the semiconductor substrate 10 along line X-X extending through regions formed with the conductive terminals 22 is shown in FIG. 13.

Finally, as shown in FIG. 14, the semiconductor substrate 10 and the layers laminated thereon are separated into the semiconductor devices formed of a plurality of semiconductor dice 10A and layers laminated thereon by dicing along the dicing line DL.

When dicing is performed, the wiring layer, which has been formed on the dicing line DL at the bottom of the opening 50w in the conventional art, does not remain on the dicing line DL at the bottom of the opening 10w. Therefore, damages to the semiconductor device caused by the dicing blade 40 coming in contact with the wiring layer 58, as has been seen in the conventional art, can be prevented.

Although the fourth resist layer 20 is a negative resist layer in this embodiment, the invention is not limited to this and can be a positive resist layer. In the case of using the positive resist layer, the mask (not shown) used for performing exposure to the fourth resist layer 20 is set on the fourth resist layer 20 in a region to be left.

Next, a semiconductor device manufacturing method of a second embodiment of the invention will be described with reference to drawings. FIGS. 15 to 18 are three-dimensional views showing the semiconductor device manufacturing method of the second embodiment. It is noted that FIGS. 15 to 18 show a portion near the dicing line DL of the semiconductor substrate. In FIGS. 15 to 18, the same numerals are given to the same components as those of the first embodiment shown in FIGS. 1 to 14.

In the semiconductor device manufacturing method of this embodiment, processes are the same as those of the first embodiment shown in FIGS. 1 to 7 until the wiring layer 18 is formed on the back surface of the semiconductor substrate 10 including the opening 10w.

Figure 15:
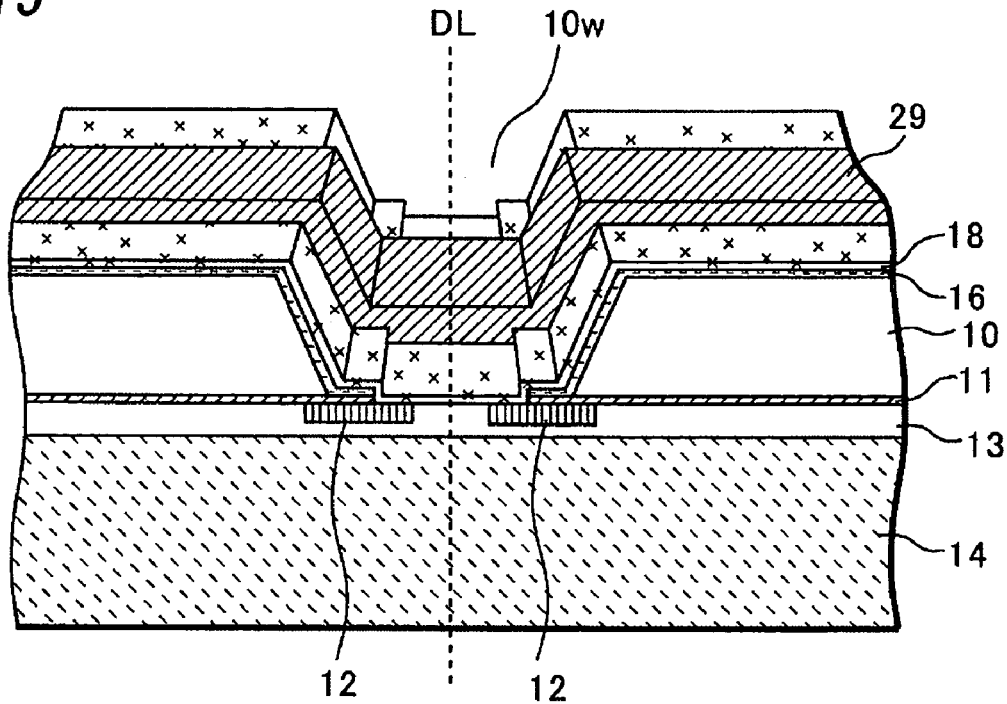
FIGS. 15-18 are three-dimensional views showing a semiconductor device manufacturing method of a second embodiment of the invention.

As shown in FIG. 15, a fifth resist layer 29 for patterning the wiring layer 18 in a predetermined pattern is formed on the wiring layer 18 on the back surface of the semiconductor substrate 10 including the inside of the opening 10w. The fifth resist layer 29 is a negative resist layer, different from the first embodiment. The thickness of the fifth resist layer 29 is preferably about 10 µm.

Then, exposure is performed to the fifth resist layer 29, using a mask (not shown) covering this layer 29 except a region above the wiring layer 18 to be left corresponding to the predetermined pattern. Then, development is performed to selectively remove the fifth resist layer 29.

Then, by using the fifth resist layer 29 as a mask, the wiring layer 18 is selectively etched and removed. This selective removing process is preferably performed by wet etching using sodium hydroxide (NaOH) or can be performed by other etching than the wet etching.

Figure 16:
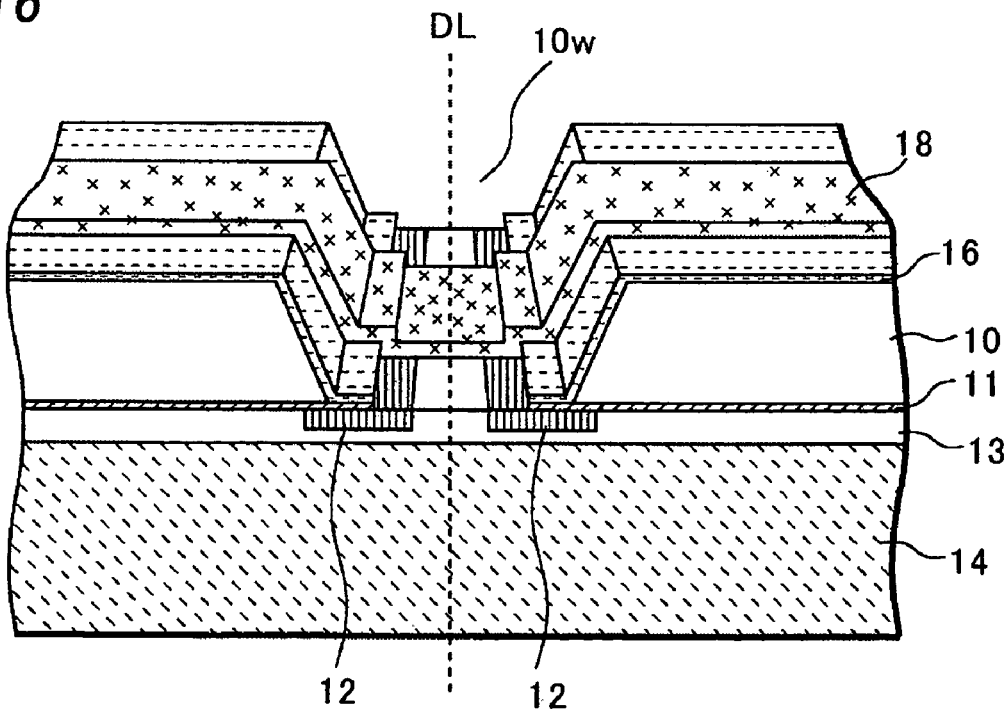

Then, the fifth resist layer 29 is removed as shown in FIG. 16. By selectively removing the wiring layer 18 as described above, the wiring layer 18 is removed in its unnecessary portion to form the predetermined pattern. It is noted that the wiring layer 18 in a region along the dicing line DL at the bottom of the opening 10w is not removed yet at this time.

Figure 17:
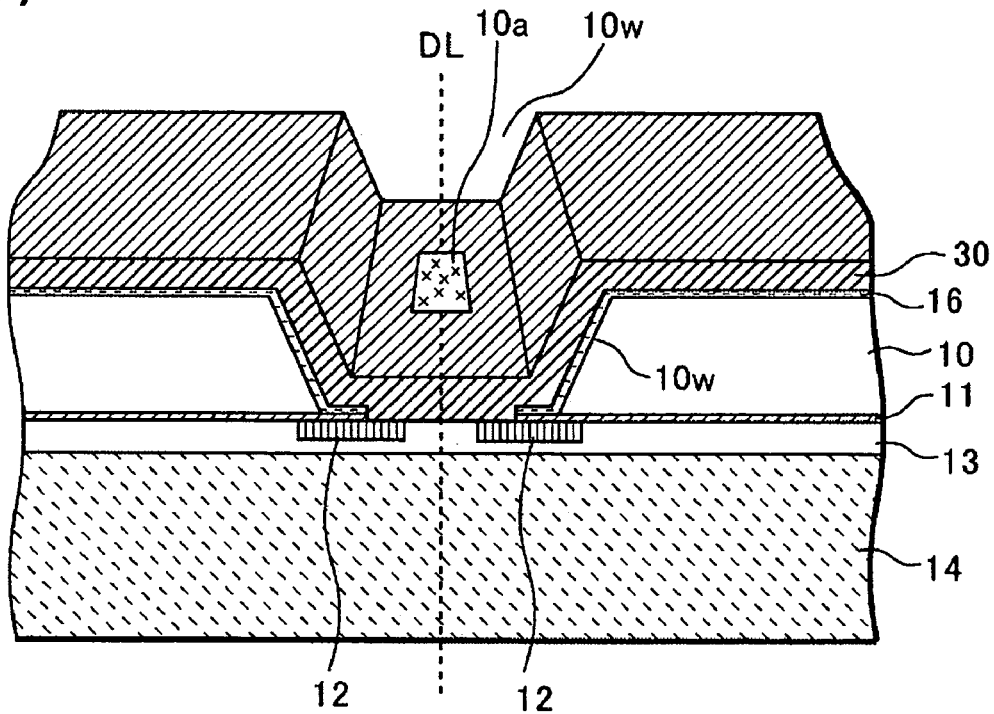

Then, a sixth resist layer 30 is formed on the wiring layer 18 on the back surface of the semiconductor substrate 10 including the inside of the opening 10w, as shown in FIG. 17. Different from the first embodiment, the sixth resist layer 30 is a positive resist layer of which an exposed portion is to be removed by development. The thickness of the sixth resist layer 30 is preferably about 10 µm.

Next, exposure is performed to the sixth resist layer 30, using a mask (not shown) covering this layer 30 except the predetermined region 10a along the dicing line DL at the bottom of the opening 10w. The predetermined region 10a along the dicing line DL at the bottom of the opening 10w is a region which is formed with no pad electrodes 12 at the bottom of the opening 10w and corresponds to a predetermined pattern of the wiring layer 18 patterned in the previous process.

As described above, the positive resist layer is used as the sixth resist layer 30 for the exposure, and the exposure is performed to the sixth resist layer 30, using the mask (not shown) covering this layer 30 except the predetermined region 10a. This does not lead to the problem described in the related art that light reaches the sidewall of the opening 50w and thus the light reflected there reaches the predetermined region of the resist layer 59 at a bottom of the opening 50w to leave the resist layer 59 there. Therefore, it can be prevented that the sixth resist layer 30 in the predetermined region 10a at the bottom of the opening 10w, which is to be removed, is failed to be removed and remains there.

Then, development is performed to remove the sixth resist layer 30 in the predetermined region 10a along the dicing line DL at the bottom of the opening 10w. The wiring layer 18 under the sixth resist layer 30 is exposed only in the predetermined region 10a along the dicing line DL at the bottom of the opening 10w.

Next, by using the sixth resist layer 30 as a mask, the wiring layer 18 is selectively etched and removed. This selective removing process is preferably performed by wet etching with sodium hydroxide (NaOH) or can be performed by other etching than the wet etching.

Figure 18:
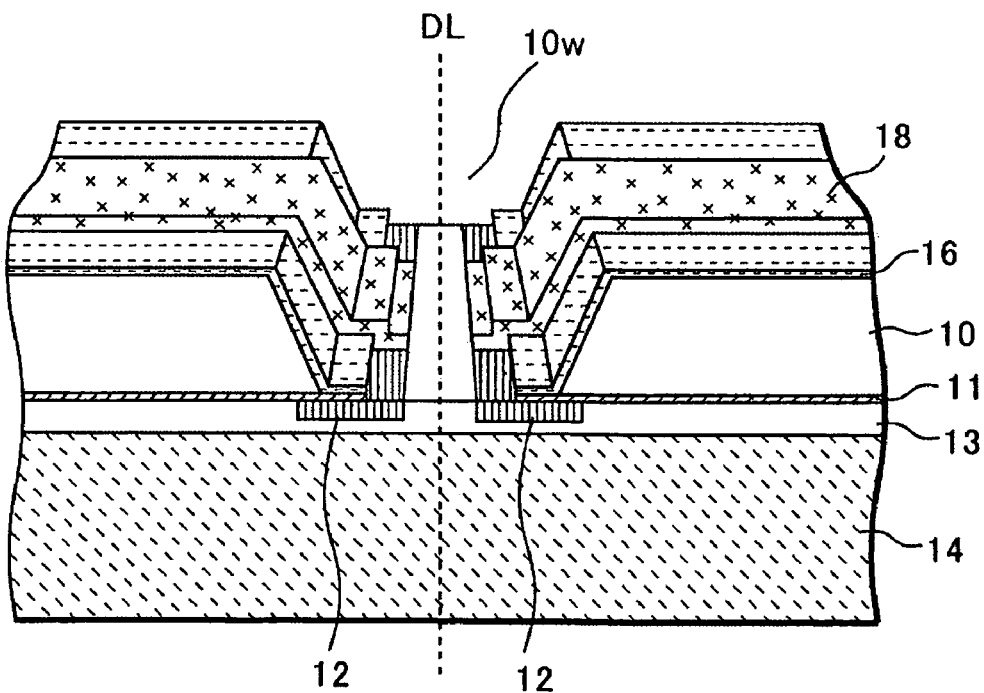
Figure 19:
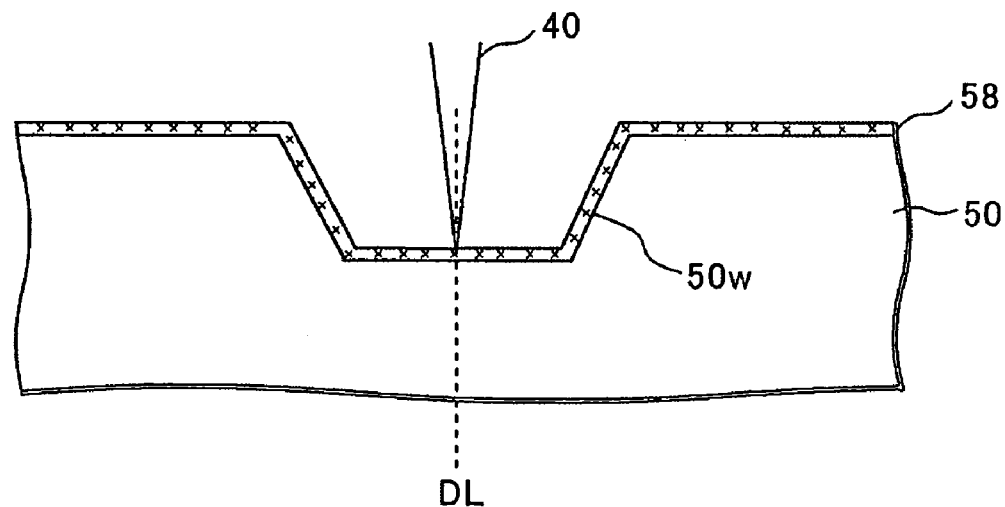
FIGS. 19-21 are cross-sectional views showing a semiconductor device manufacturing method of the conventional art.
Figure 20:
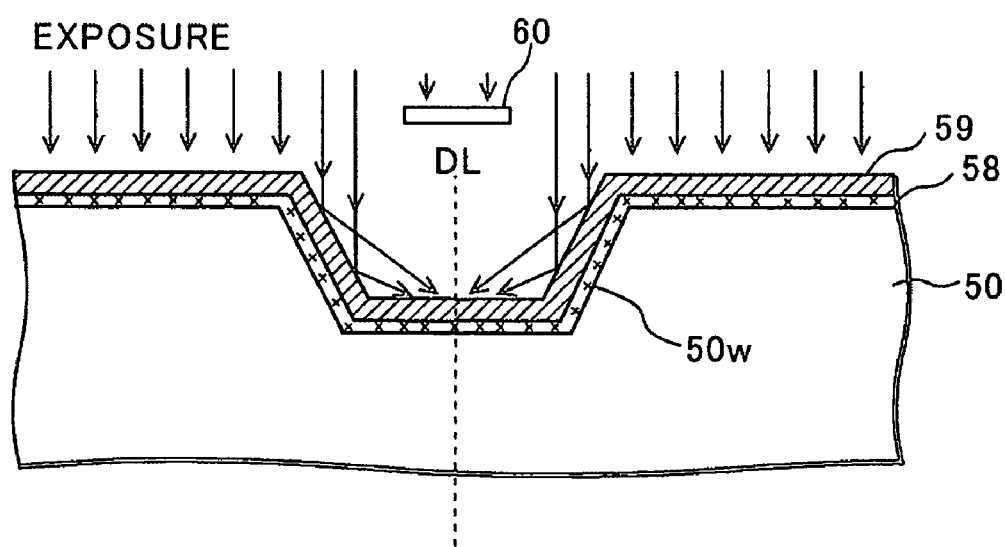
Figure 21:
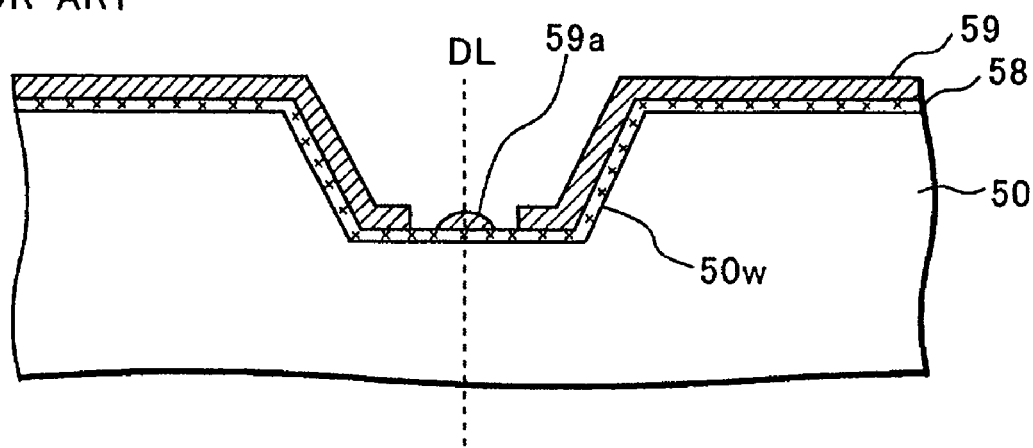

Then, the sixth resist layer 30 is removed as shown in FIG. 18. By selectively removing the wiring layer 18 as described above, the wiring layer 18 is removed only in the predetermined region 10a along the dicing line DL at the bottom of the opening 10w. In the predetermined region 10a where the wiring layer 18 is removed, the resin layer 13 is exposed.

As described above, the wiring layer 18 undergoes two selective removing processes using the fifth resist layer 29 and the sixth resist layer 30, so that the wiring layer 18 is patterned so as to form the predetermined pattern and be separated at the predetermined region 10a along the dicing line DL at the bottom of the opening 10w without fail.

By selectively removing the wiring layer 18 as described above, it can be prevented that the wiring layer remains on the dicing line DL at the bottom of the opening 50w as has been seen in the conventional art. That is, in a process of separating a layer to be patterned such as the wiring layer 18 formed on the semiconductor substrate 10 having a three-dimensional structure like having the opening 10w, reliability can be improved more than the conventional art.

Furthermore, in the exposure process performed when the fifth resist layer 29 or the sixth resist layer 30 is selectively removed, it is not necessary to devote care on an effect of light being reflected at the sidewall of the opening 10w and reaching the bottom thereof. Therefore, conditions for performing exposure to the resist layer can be eased.

Then, in the same manner as the processes of the first embodiment shown in FIGS. 12 to 14, the protection layer 21 and the conductive terminals 22 are formed on the back surface of the semiconductor substrate 10 including on the wiring layer 18, and finally dicing is performed.

When dicing is performed, the wiring layer, which has been formed on the dicing line DL at the bottom of the opening 50w in the conventional art, does not remain on the dicing line DL at the bottom of the opening 10w. Therefore, damages to the semiconductor device caused by the dicing blade 40 coming in contact with the wiring layer 58, as has been seen in the conventional art, can be prevented.

Although the fifth resist layer 29 is a negative resist layer in this embodiment, the invention is not limited to this and can be a positive resist layer. In the case of using the positive resist layer, the mask (not shown) used for performing exposure to the fifth resist layer 29 covers the fifth resist layer 29 in a region to be left.

Although the conductive terminals 22 are formed on the wiring layer 18 in the first and second embodiments described above, the invention is not limited to this. That is, the invention can be applied to a semiconductor device formed with no conductive terminal, for example, a LGA (land grid array) type semiconductor device.

Although the opening 10w is formed so as to penetrate the semiconductor substrate 10 in the first and second embodiments described above, the invention is not limited to this. That is, the opening 10w may be replaced by a concave portion formed on the back surface of the semiconductor substrate 10 without penetrating the semiconductor substrate 10. In this case, the support body 14 formed on the front surface of the semiconductor substrate 10 can be removed in any one of the described processes. Alternatively, the support body 14 can be left without being removed, or can be omitted. In the following claims, the term "recess" is used to refer to both the opening 10w and the concave portion explained above.

What is claimed is:

1. A method of manufacturing a semiconductor device, comprising:
   providing a semiconductor substrate;
   forming a recess in the substrate along a dicing line of the substrate by etching the substrate from a back surface thereof;
   forming a layer that is disposed in the recess and on the back surface of the substrate;
   forming a first resist layer on the layer so that the first resist layer has an opening at a predetermined location at a bottom of the recess;
   etching the layer using the first resist layer as a mask so as to form a corresponding opening in the layer;
   removing the first resist layer to expose the layer;
   forming on the exposed layer a second resist layer that corresponds to a predetermined pattern and covers the opening of the layer; and
   etching the layer using the second resist layer as a mask so that the predetermined pattern is reflected in the layer.

2. The method of claim 1, wherein the first resist layer is a positive resist layer and the second resist layer is a negative resist layer.

3. A method of manufacturing a semiconductor device, comprising:
   providing a semiconductor substrate;
   forming a recess in the substrate along a dicing line of the substrate by etching the substrate from a back surface thereof;
   forming a layer that is disposed in the recess and on the back surface of the substrate;
   forming on the layer a first resist layer that corresponds to a predetermined pattern;
   etching the layer using the first resist layer as mask so that the predetermined pattern is reflected in the layer;
   removing the first resist layer to expose the patterned layer;
   forming on the patterned layer a second resist layer that has an opening at a predetermined location at a bottom of the recess; and
   etching the patterned layer using the second resist layer as a mask so as to form a corresponding opening in the patterned layer.

4. The method of claim 3, wherein the first resist layer is a negative resist layer and the second resist layer is a positive resist layer.

5. A method of manufacturing a semiconductor device, comprising:
   providing a semiconductor substrate comprising a first insulation film formed on a front surface of the substrate and a pad electrode formed on the first insulation film along a dicing line of the substrate;
   attaching a support body to the front surface of the substrate;
   forming a recess in the substrate along the dicing line by etching the substrate from a back surface thereof, the recess corresponding to the entire length of the dicing line or part of the length;
   forming a second insulation film to cover the recess and the back surface of the substrate;
   etching the first and second insulation films at a bottom of the recess so that part of the pad electrode is exposed;
   forming a wiring layer that is disposed in the recess and on the back surface of the substrate and connected with the exposed pad electrode;
   forming a first resist layer on the wiring layer so that the first resist layer has an opening at a predetermined location at the bottom of the recess;
   etching the wiring layer using the first resist layer as a mask so as to form a corresponding opening in the wiring layer;
   removing the first resist layer to expose the wiring layer;
   forming on the exposed wiring layer a second resist layer that corresponds to a predetermined pattern and covers the opening of the wiring layer; and
   etching the wiring layer using the second resist layer as a mask so that the predetermined pattern is reflected in the wiring layer.

6. The method of claim 5, wherein the first resist layer is a positive resist layer and the second resist layer is a negative resist layer.

7. The method of claim 6, further comprising forming a protection layer on the back surface of the substrate so that part of the wiring layer is exposed in an opening formed in the protection layer, and forming a conductive terminal on the exposed part of the wiring layer.

8. The method of claim 7, further comprising cutting along the dicing line to produce a semiconductor dice.

9. The method of claim 6, further comprising cutting along the dicing line to produce a semiconductor dice.

10. The method of claim 5, further comprising forming a protection layer on the back surface of the substrate so that part of the wiring layer is exposed in an opening formed in the protection layer, and forming a conductive terminal on the exposed part of the wiring layer.

11. The method of claim 10, further comprising cutting along the dicing line to produce a semiconductor dice.

12. The method of claim 5, further comprising cutting along the dicing line to produce a semiconductor dice.

13. A method of manufacturing a semiconductor device, comprising:
   providing a semiconductor substrate comprising a first insulation film formed on a front surface of the substrate and a pad electrode formed on the first insulation film along a dicing line of the substrate;
   attaching a support body to the front surface of the substrate;
   forming a recess in the substrate along the dicing line by etching the substrate from a back surface thereof, the recess corresponding to the entire length of the dicing line or part of the length;
   forming a second insulation film to cover the recess and the back surface of the substrate;
   etching the first and second insulation films at a bottom of the recess so that part of the pad electrode is exposed;
   forming a wiring layer that is disposed in the recess and on the back surface of the substrate and connected with the exposed pad electrode;
   forming on the wiring layer a first resist layer that corresponds to a predetermined pattern;
   etching the wiring layer using the first resist layer as mask so that the predetermined pattern is reflected in the wiring layer;
   removing the first resist layer to expose the patterned wiring layer;
   forming on the patterned wiring layer a second resist layer that has an opening at a predetermined location at the bottom of the recess; and
   etching the patterned wiring layer using the second resist layer as a mask so as to form a corresponding opening in the patterned wiring layer.

14. The method of claim 13, wherein the first resist layer is a negative resist layer and the second resist layer is a positive resist layer.

15. The method of claim 14, further comprising forming a protection layer on the back surface of the substrate so that part of the wiring layer is exposed in an opening formed in the protection layer, and forming a conductive terminal on the exposed part of the wiring layer.

16. The method of claim 15, further comprising cutting along the dicing line to produce a semiconductor dice.

17. The method of claim 14, further comprising cutting along the dicing line to produce a semiconductor dice.

18. The method of claim 13, further comprising forming a protection layer on the back surface of the substrate so that part of the wiring layer is exposed in an opening formed in the protection layer, and forming a conductive terminal on the exposed part of the wiring layer.

19. The method of claim 18, further comprising cutting along the dicing line to produce a semiconductor dice.

20. The method of claim 13, further comprising cutting along the dicing line to produce a semiconductor dice.

* * * * *